United States Patent
Liu et al.

(10) Patent No.: US 10,494,252 B2
(45) Date of Patent: Dec. 3, 2019

(54) MEMS DEVICES AND METHODS OF MANUFACTURING THE SAME

(71) Applicant: TAIWAN SEMICONDUCTOR MANUFACTURING COMPANY LTD., Hsinchu (TW)

(72) Inventors: Yu-Chia Liu, Kaohsiung (TW); Chia-Hua Chu, Hsinchu County (TW); Chun-Wen Cheng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 14/861,346

(22) Filed: Sep. 22, 2015

(65) Prior Publication Data
US 2017/0081173 A1    Mar. 23, 2017

(51) Int. Cl.
*B81C 1/00* (2006.01)

(52) U.S. Cl.
CPC .... *B81C 1/00182* (2013.01); *B81C 2201/019* (2013.01); *B81C 2203/0118* (2013.01)

(58) Field of Classification Search
CPC ............... B81C 1/005; B81C 2201/0111–0114
See application file for complete search history.

(56) References Cited

U.S. PATENT DOCUMENTS

| | | | | |
|---|---|---|---|---|
| 7,578,189 B1 * | 8/2009 | Mehregany | ......... | B81C 1/00182 73/514.18 |
| 7,851,875 B2 * | 12/2010 | Schoen | ............... | B81C 1/00182 257/415 |
| 2007/0220971 A1 * | 9/2007 | Ayazi | ................. | G01C 19/5698 73/504.02 |
| 2009/0278628 A1 * | 11/2009 | Sworowski | ......... | B81C 1/00198 333/186 |
| 2009/0302415 A1 * | 12/2009 | Mueller | .............. | B81C 1/00246 257/508 |
| 2012/0061776 A1 * | 3/2012 | Cheng | ................. | B81C 1/00333 257/415 |
| 2012/0068276 A1 * | 3/2012 | Lin | ..................... | B81C 1/00571 257/415 |
| 2012/0262026 A1 * | 10/2012 | Lin | ....................... | B81B 3/0072 310/300 |
| 2013/0020718 A1 * | 1/2013 | Chou | ..................... | H01L 24/80 257/774 |
| 2013/0093527 A1 * | 4/2013 | Xiao | .................... | H03H 3/0072 331/155 |
| 2013/0105921 A1 * | 5/2013 | Najafi | ................. | G01P 15/0802 257/415 |
| 2013/0168852 A1 * | 7/2013 | Liang | ................. | B81C 1/00293 257/737 |
| 2013/0230939 A1 * | 9/2013 | Lee | .................... | B81C 1/00619 438/52 |

\* cited by examiner

*Primary Examiner* — Bryan R Junge
(74) *Attorney, Agent, or Firm* — WPAT, P.C., Intellectual Property Attorneys; Anthony King

(57) ABSTRACT

The present disclosure provides a CMOS MEMS device. The CMOS MEMS device includes a first substrate, a second substrate, a first polysilicon and a second polysilicon. The second substrate includes a movable part and is located over the first substrate. The first polysilicon penetrates the second substrate and is adjacent to a first side of the movable part of the second substrate. The second polysilicon penetrates the second substrate and is adjacent to a second side of the movable part of the second substrate.

19 Claims, 11 Drawing Sheets

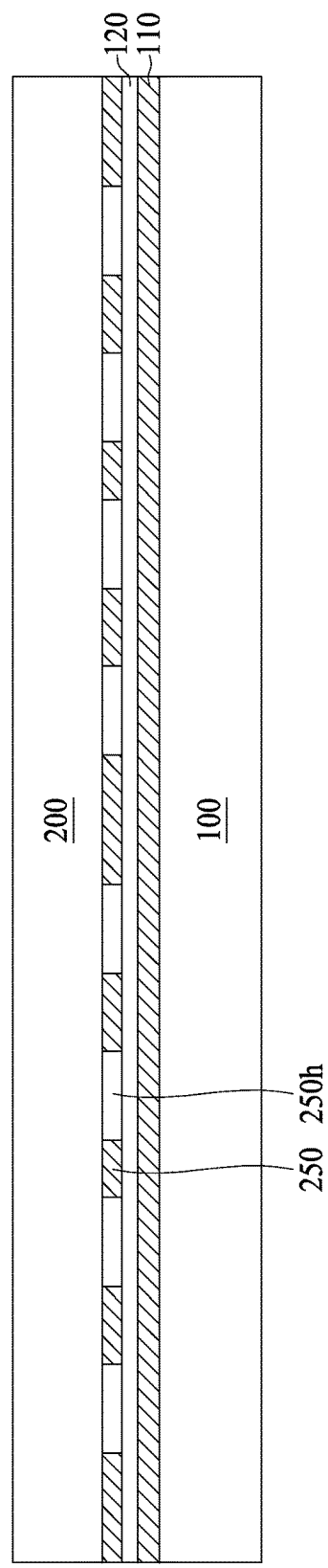

MEMS DEVICES AND METHODS OF MANUFACTURING THE SAME

BACKGROUND

The semiconductor integrated circuit (IC) industry has experienced rapid growth. Technological advances in IC materials and design have produced generations of ICs where each generation has smaller and more complex circuits than the previous generation. Over the course of IC evolution, functional density (i.e., the number of interconnected devices per chip area) has generally increased while geometric sizes (i.e., the smallest component that can be created using a fabrication process) have decreased.

Micro-electro mechanical system (MEMS) devices have recently been developed. MEMS devices include devices fabricated using semiconductor technology to form mechanical and electrical features. The MEMS devices are implemented in accelerometers, pressure sensors, microphones, actuators, mirrors, heaters, and/or printer nozzles.

A MEMS device formed in a semiconductor process requires forming a movable structure with a certain mass. In prior approaches, a thin film layer is provided and patterned to form a movable part that is coupled to the remaining structures by flexible supports, which allow the movable part to move in certain directions. However, the thin film structure will induce residue stress on the MEMS device and degrade the performance of the MEMS device. It is desirable to develop a MEMS device with an alternate thin film structure so as to achieve better performance.

BRIEF DESCRIPTION OF THE DRAWINGS

Aspects of the present disclosure are best understood from the following detailed description when read with the accompanying drawings. It is noted that, in accordance with the practices in the industry, various features are not drawn to scale. In fact, the dimensions of the various features may be arbitrarily increased or reduced for clarity of discussion.

FIGS. 3A-3H are a series of cross-sectional views illustrating processing steps to fabricate the MEMS device shown in FIG. 2, in accordance with some embodiments.

DETAILED DESCRIPTION

Figure 1A:
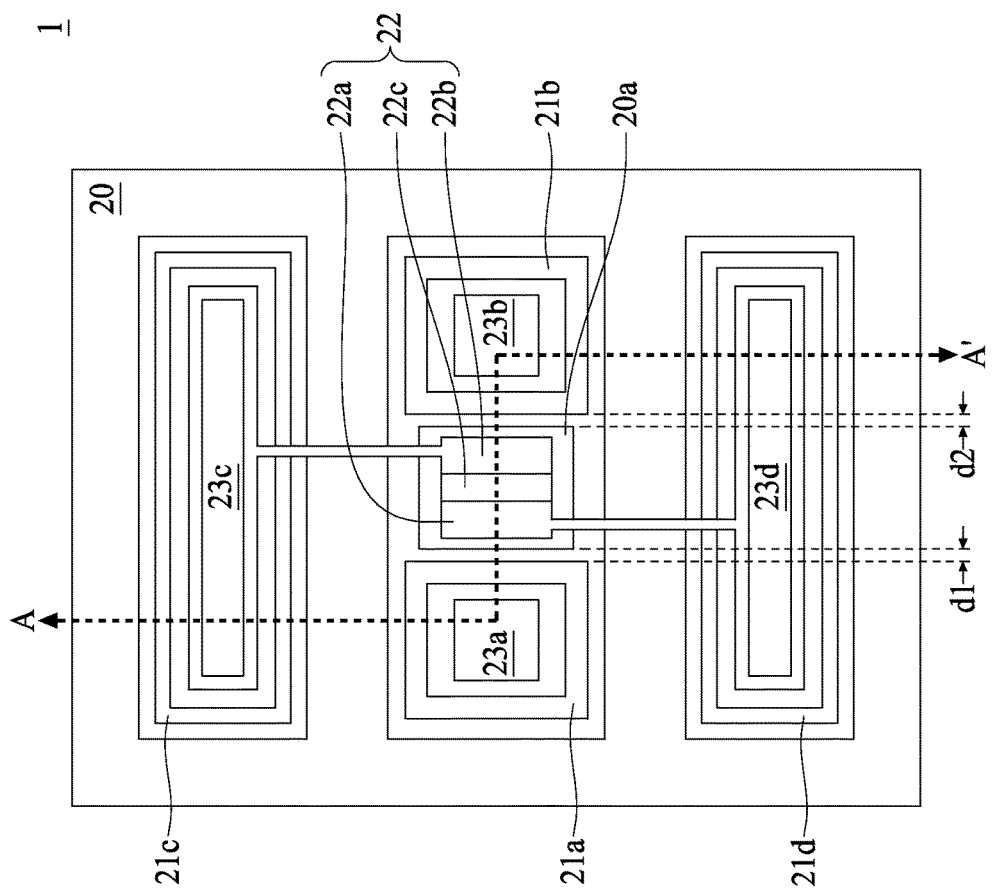
FIG. 1A is a top view of a MEMS device, in accordance with some embodiments.

The following disclosure provides many different embodiments, or examples, for implementing different features of the present invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship with another element(s) or feature(s) as illustrated in the drawings. The spatially relative terms are intended to encompass different orientations of the device in use or operation in addition to the orientation depicted in the drawings. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the present invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. Each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present invention relates generally to MEMS devices. The following description is presented to enable one of ordinary skill in the art to make and use the present invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In the described embodiments, MEMS refers to a class of structures or devices fabricated using semiconductor-like processes and exhibiting mechanical characteristics such as the ability to move or deform. MEMS often, but not always, interact with electrical signals. MEMS devices include, but are not limited to, gyroscopes, accelerometers, magnetometers, pressure sensors, and radio-frequency components. In some embodiments, a MEMS device structure may include a plurality of the aforesaid MEMs devices. Silicon wafers containing a MEMS device or a MEMS device structure are referred to as MEMS wafers.

In the described embodiments, a MEMS device may be a semiconductor device implemented as a micro-electro-mechanical system. A MEMS device structure may be any feature associated with an assembly of a plurality of MEMS devices. An engineered silicon-on-insulator (ESOI) wafer may be a SOI wafer with cavities beneath the silicon device layer or substrate. A cap or handle wafer typically is a thicker substrate used as a carrier for the thinner silicon sensing substrate in a silicon-on-insulator wafer. A cap or handle substrate and a cap or handle wafer can be interchanged. In the described embodiments, a cavity may be an opening or recession in a substrate wafer and an enclosure may refer to a fully enclosed space.

FIG. 1A illustrates a top view of a MEMS device 1 in accordance with one embodiment of the present disclosure. The MEMS device 1 includes a device substrate 20, a plurality of polysilicon 21a, 21b, 21c, 21d, a plurality of electrodes 23a, 23b, 23c, 23d and a conductive layer 22.

The device substrate 20 includes a movable element 20a. A first side of the movable element 20a is adjacent to the polysilicon 21a, and a second side of the movable element 20a opposite the first side is adjacent to the polysilicon 21b. In one embodiment, the distance d1, d2 between the first side of the movable element 20a and the polysilicon 21a or the polysilicon 21b is less than approximately 0.5 μm. The movable element 20a can move horizontally between the polysilicon 21a and the polysilicon 21b.

The movable element 20a and the polysilicon 21a define a capacitor structure. The capacitance of the capacitor structure is determined by the distance between the movable element 20a and the polysilicon 21a. Similarly, the movable element 20a and the polysilicon 21b define a capacitor structure. The capacitance of the capacitor structure is determined by the distance between the movable element 20a and the polysilicon 21b. The horizontal movement of the movable element 20a would change the capacitance of the capacitor structure between the movable element 20a and the polysilicon 21a or the polysilicon 21b. The conductivity of the polysilicon 21a, 21b is different from that of the movable element 20a. In one embodiment, the movable element 20a is formed of crystalline silicon.

The conductive layer 22 is located above the movable element 20a. The conductive layer 22 includes two electrodes 22a, 22b and an isolation layer 22c. In one embodiment, the electrodes 22a, 22b are formed of molybdenum (Mo) and the isolation layer 22c is formed of aluminum nitride (AlN). The electrode 22a of the conductive layer 22 is electrically connected to the electrode 23d located above the polysilicon 21d, and the electrode 22b of the conductive layer 22 is electrically connected to the electrode 23c located above the polysilicon 21c. In one embodiment, the signal representing the variation of the capacitance of the capacitor structure defined by the movable element 20a and the polysilicon 21a or the polysilicon 21b can be transmitted from the electrodes 22a, 22b of the conductive layer 22 to external circuit (not shown in the drawing) via the electrodes 23d, 23c. In another embodiment, a control signal can be sent from the external circuit to the electrodes 22a, 22b of the conductive layer via the electrodes 23d, 23c to control the movement of the movable element 20a.

The capacitance of a capacitor is defined by the following equation: $C=(\varepsilon^* A)/d$, where $\varepsilon$ is permittivity, A is the area of each electrode of the capacitor and d is the distance between two electrodes of the capacitor. Based on the above equation, a high capacitance can be obtained by increasing the area of the electrode and reducing the distance between two electrodes. In accordance with one embodiment of the present disclosure, since the distance d1, d2 between the first side of the movable element 20a and the polysilicon 21a or the polysilicon 21b is less than approximately 0.5 m, the MEMS device 1 would have a higher capacitance than conventional MEMS devices. The MEMS device 1 would also have better performance due to its higher capacitance.

Furthermore, because the polysilicon 21a, 21b and the movable element 20a can be made of materials with different levels of conductivity, it is more flexible to design a capacitor structure defined by the movable element 20a and the polysilicon 21a, 21b.

Figure 1B:
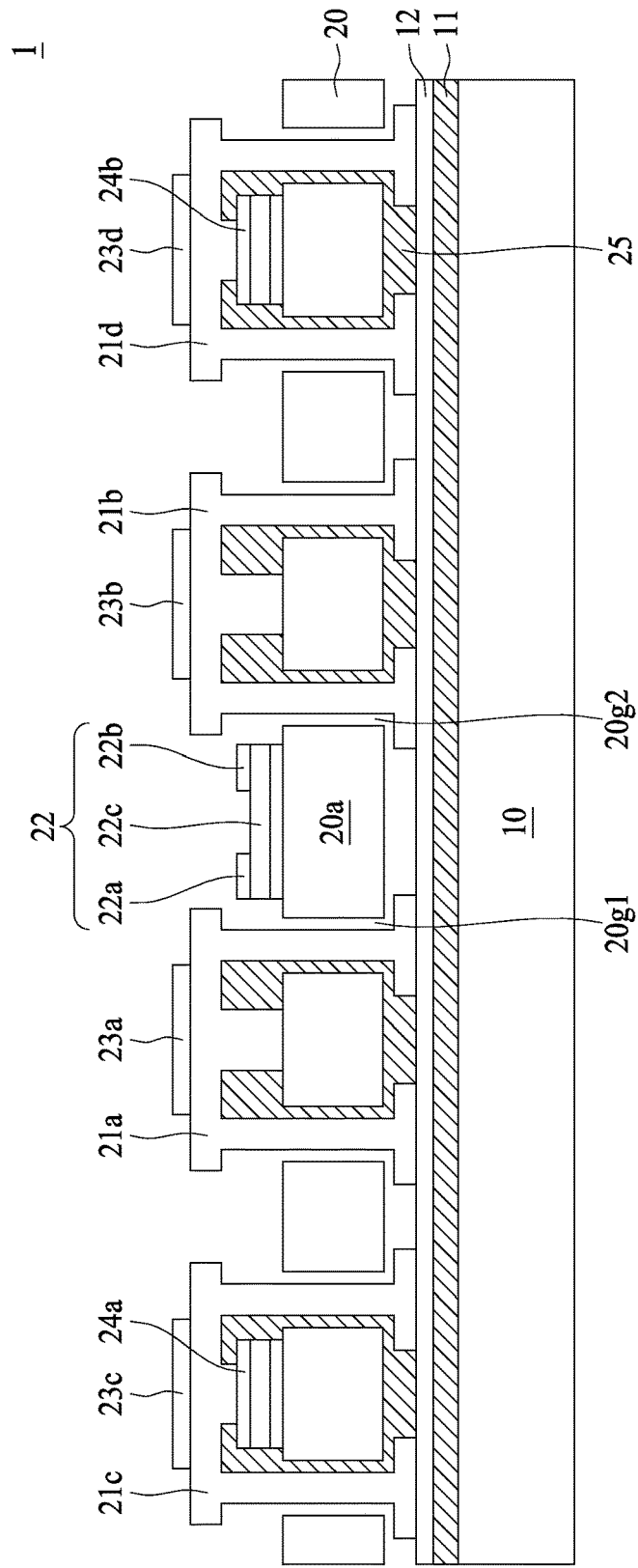
FIG. 1B is a cross-sectional view of the MEMS device shown in FIG. 1A, in accordance with some embodiments.

FIG. 1B is a cross-sectional view of the MEMS device 1 shown in FIG. 1A, taken along the line A-A'. The MEMS device 1 includes a handle substrate 10, an oxide layer 11, a protection layer, a device substrate 20, a plurality of polysilicon 21a, 21b, 21c, 21d, a plurality of electrodes 23a, 23b, 23c, 23d and a conductive layer 22.

The handle substrate 10 may be a semiconductor substrate (such as a silicon substrate) or a portion of a semiconductor substrate. The handle substrate 10 may be formed of silicon, or other materials such as silicon germanium, silicon carbide, or the like. The handle substrate 10 may be formed of low resistive silicon. Alternatively, the handle substrate 10 may be an SOI substrate. The SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

The oxide layer 11 is on the handle substrate 10 and the protection layer 12 is on the oxide layer 11. The protection layer 12 is used as an etching stop layer to prevent the handle substrate 10 from being etched during the etching process for manufacturing the device substrate 20. In some embodiments, the protection layer 12 is made of low stress nitride (LSN).

The device substrate 20 is above the protection layer 12. The polysilicon 21a and the polysilicon 21b penetrate the device substrate 20 and are placed on the protection layer 12. In one embodiment, as shown in FIG. 1B, the polysilicon 21a, 21b are shaped like an anchor structure. Therefore, the bottom portion of the polysilicon 21a, 21b is wider the diameter of the hole through which the polysilicon 21a, 21b penetrate. The device substrate 20 includes a movable element 20a. A first side of the movable element 20a is adjacent to the polysilicon 21a, and a second side of the movable element 20a opposite to the first side is adjacent to the polysilicon 21b. The first side of the movable element 20a and the polysilicon 21a form a gap 20g1 and the second side of the movable element 20a and the polysilicon 21b form a gap 20g2. In one embodiment, the gap 20g1 or the 20g2 is less than approximately 0.5 μm. The movable element 20a can move horizontally between the polysilicon 21a and the polysilicon 21b. In one embodiment, the device substrate 20 has a thickness of approximately from 20 um to 40 um. The use of the thick device substrate 20 can strengthen the structure of the MEMS device 1, so as to reduce the residual stress that would occur in a conventional MEMS device caused by the deposition of the thin film structure.

The movable element 20a and the polysilicon 21a define a capacitor structure. The capacitance of the capacitor structure is determined by the distance between the movable element 20a and the polysilicon 21a. Similarly, The movable element 20a and the polysilicon 21b define a capacitor structure. The capacitance of the capacitor structure is determined by the distance between the movable element 20a and the polysilicon 21b. The horizontal movement of the movable element 20a would change the capacitance of the capacitor structure between the movable element 20a and the polysilicon 21a or the polysilicon 21b. The conductivity of the polysilicon 21a, 21b is different from that of the movable element 20a. In one embodiment, the movable element 20a is formed of crystalline silicon.

The conductive layer 22 is located above the movable element 20a. The conductive layer 22 includes two electrodes 22a, 22b and an isolation layer 22c. In one embodiment, the electrodes 22a, 22b are formed of molybdenum (Mo) and the isolation layer 22c is formed of AlN. The electrode 22a of the conductive layer 22 is electrically connected to the conductive layer 24a located on the device substrate 20 and the conductive layer 24a is electrically connected to the electrode 23c located on the polysilicon 21c. The electrode 22b of the conductive layer 22 is electrically connected to the conductive layer 24b located on the device substrate 20 and the conductive layer 24b is electrically connected to the electrode 23d located on the polysilicon 21d. The electrodes 23c and 23d can connect to external circuits (not shown) to transfer the signal from the conductive layer to the external circuits or vice versa. In one embodiment, the signal representing the variation of the capacitance of the capacitor structure defined by the movable element 20a and the polysilicon 21a or the polysilicon 21b can be transmitted from the electrodes 22a, 22b of the conductive layer 22 to the external circuits via the electrodes 23d and 23c respectively. In another embodiment, a control signal can be sent from the external circuits to the electrodes 22a, 22b of the conductive layer via the electrodes 23d and 23c to control the movement of the movable element 20a. In one embodiment, the electrodes 23a and 23b on the polysilicon 21a and 21b respectively can connect to the ground to provide grounding terminals. In another embodiment, the electrodes 23a and 23b can be removed from the polysilicon 21a and 21b.

The capacitance of a capacitor is defined by the following equation: $C=(\varepsilon*A)/d$, where $\varepsilon$ is permittivity, A is the area of each electrode of the capacitor and d is the distance between two electrodes of the capacitor. Based on the above equation, a high capacitance can be obtained by increasing the area of the electrode and reducing the distance between two electrodes. In accordance with the embodiment of the present disclosure, since the gap 20g1 or the gap 20g2 is less than approximately 0.5 μm, the MEMS device 1 would have a higher capacitance than conventional MEMS devices. The MEMS device 1 would also have better performance due to its higher capacitance. Furthermore, because the polysilicon 21a, 21b and the movable element 20a can be made of materials with different levels of conductivity, it is more flexible to design a capacitor structure defined by the movable element 20a and the polysilicon 21a, 21b.

Figure 2:
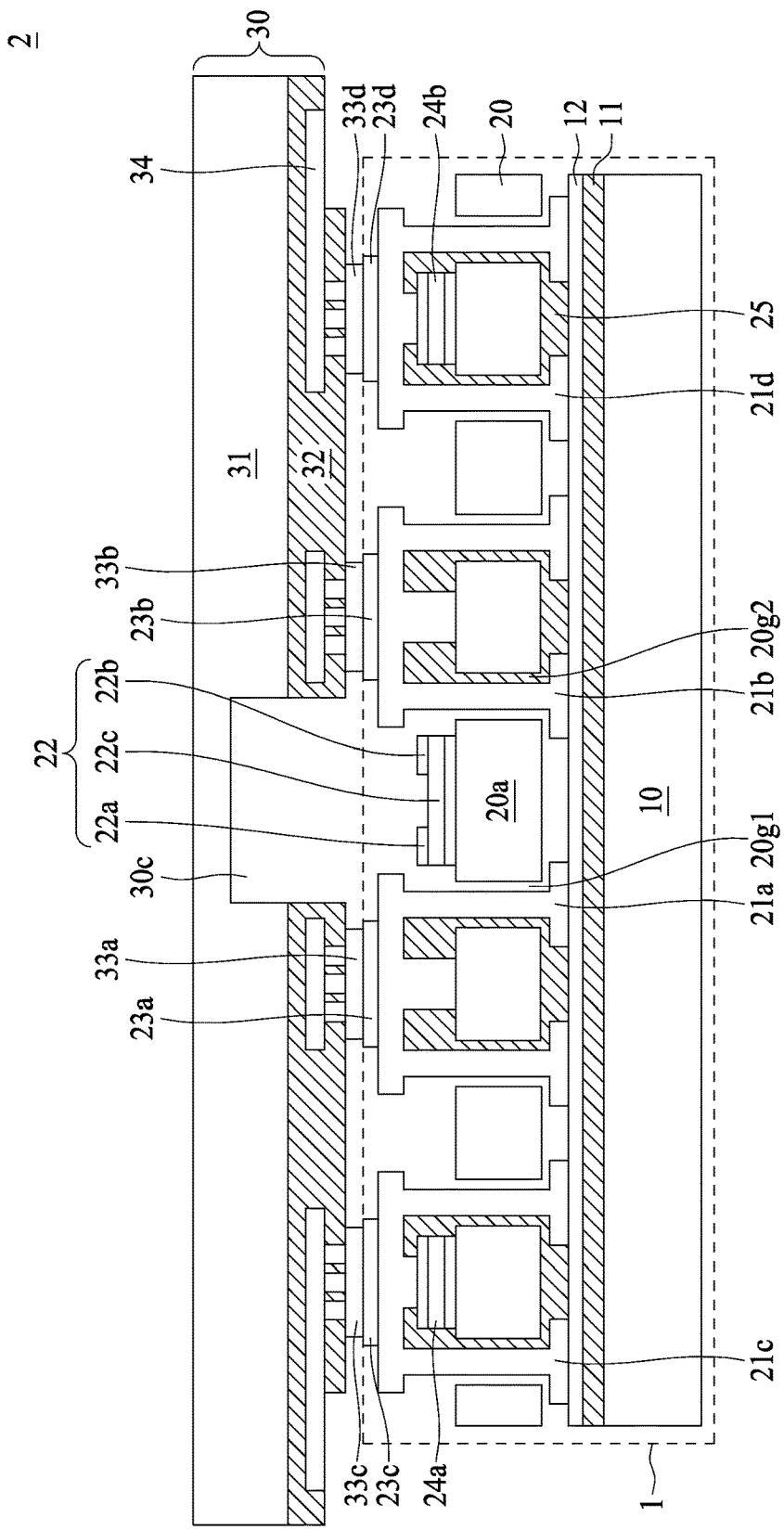
FIG. 2 is a cross-sectional view of a MEMS device, in accordance with some embodiments.

FIG. 2 is a cross-sectional view of a MEMS device 2, in accordance with one embodiment of the present disclosure. The MEMS device 2 includes the MEMS device 1 shown in FIG. 1B and a CMOS wafer 30.

The CMOS wafer 30 may include a substrate 31 and an interconnect structure 32. The substrate 31 may include a semiconductor material such as silicon although other semiconductor materials may be used. A plurality of CMOS devices (such as transistors, capacitors, resistors, diodes, photodiodes, fuses, and the like, not shown in the drawing) are formed on a surface of the substrate 31. Furthermore, an interconnect structure 32 is used to electrically couple the CMOS devices. The interconnect structure 32 may include dielectric layers, which further include low-k dielectric layers, non-low-k dielectric layers such as passivation layers, and the like. Metal lines and vias, which may be formed of copper, aluminum, or combinations thereof, are formed in the dielectric layers. A plurality of electrodes 33a, 33b, 33c, 33d are formed at a predetermined location on the interconnect structure 32 corresponding to the electrodes 23a, 23b, 23c, 23d, respectively.

The CMOS wafer 30 is placed over the device substrate 20. The electrodes 33a, 33b, 33c, 33d of the CMOS wafer 30 respectively electrically connect to the electrodes 23a, 23b, 23c, 23d to provide electrical paths between the CMOS wafer 30 and the device substrate 20. In one embodiment, the signal representing the variation of the capacitance of the capacitor structure defined by the movable element 20a and the polysilicon 21a or the polysilicon 21b can be transmitted from the electrodes 22a, 22b of the conductive layer 22 to the CMOS device of the COMS wafer 30 through the electrical paths between the CMOS wafer 30 and the device substrate 20. In another embodiment, a control signal can be sent from the CMOS device of the COMS wafer 30 to the electrodes 22a, 22b of the conductive layer through the electrical paths between the CMOS wafer 30 and the device substrate 20 to control the movement of the movable element 20a.

The CMOS wafer 30 includes an opening 30c at a location corresponding to the movable element 20a of the device substrate 20. Therefore, the CMOS wafer 30 and the device substrate 20 would define a cavity in which the movable element 20a is located after the CMOS wafer 30 is bonded to the device substrate 20. The cavity would increase the space in which the movable element 20a is accommodated. Increasing the space would reduce the cavity pressure exerted on the movable element 20a, thereby enhancing the performance of the MEMS device 2.

FIGS. 3A-3H are a series of cross-sectional views illustrating processing steps to fabricate a MEMS device, according to an embodiment of the present disclosure.

Referring to FIG. 3A, a handle substrate 100 is provided. The handle substrate 100 may be formed of silicon, or other materials such as silicon germanium, silicon carbide, or the like. The handle substrate 100 may be formed of low resistive silicon. Alternatively, the handle substrate 100 may be an SOI substrate. The SOI substrate may include a layer of semiconductor material (e.g., silicon, germanium, and the like) formed over an insulator layer (e.g., buried oxide), which is formed in a silicon substrate. Other substrates that may be used include multi-layered substrates, gradient substrates, hybrid orientation substrates, and the like.

An oxide layer 110 is formed on the handle substrate 100. The oxide layer 110 may be a thermal oxide layer formed by performing thermal oxidation on the handle substrate 100.

A protection layer 120 is formed over the oxide layer 110. The protection layer 120 may be deposited using, for example, low pressure chemical vapor deposition (LPCVD). The protection layer 120 may be used as an etch stop layer and may be formed of LSN. However, other materials such as aluminum nitride, aluminum oxide, silicon carbide, or other dielectrics chemically resistant to etching may be used as well.

An oxide layer 250 is formed on the protection layer 120. The oxide layer 250 can be formed by high density plasma (HDP), chemical vapor deposition (CVD), LPCVD, plasma enhanced CVD (PECVD) or other suitable methods. The oxide layer 250 is then patterned to form a plurality of openings 250h. The oxide layer 250 may be patterned using, for example, a combination of photolithography and etching techniques. Furthermore, the oxide layer 250 may be thinned (not shown) until a desired thickness is achieved. The thinning process may be implemented by using suitable techniques such as grinding, polishing, and/or chemical etching. For example, a chemical mechanical polishing (CMP) process may be used to thin the oxide layer 250.

A device substrate 200 is fusion bonded to the handle substrate 100. Please note that in the exemplary embodiment of the present disclosure, the device substrate 200 and the handle substrate 100 are bonded together by fusion bonding at relatively high temperatures, which enables a more complete removal of chemical elements from the dielectric materials in the substrates prior to sealing cavities of the MEMS structures. Fusion bonding makes high temperature annealing on both sides of wafers possible, which reduces outgassing of chemical elements during the cavity formation process. MEMS structures bonded by fusion bonding are mechanically stronger than those bonded by metal bonding due to a higher bonding ratio. In addition, fusion bonding enables the formation of through substrate vias (TSVs) in the MEMS structures without degrading yield. However, the concept of the present disclosure is not limited thereto. One of ordinary skill in the art would recognize many variations, modifications, and alternatives. The concept of the present disclosure may be also applied to other types of MEMS device assembly in some embodiments. For example, the device substrate 200 can be bonded to the handle substrate 100 by any suitable technique such as anodic bonding, eutectic bonding, and the like. The device substrate 200 may be a substrate that is substantially similar to the handle substrate 100. The device substrate 200 may be thinned to a desired thickness. The thinning process may include grinding and CMP processes, etch back processes, or other acceptable processes. In one embodiment, the device substrate may have a thickness in the range from approximately 20 um to 40 um.

Figure 3B:
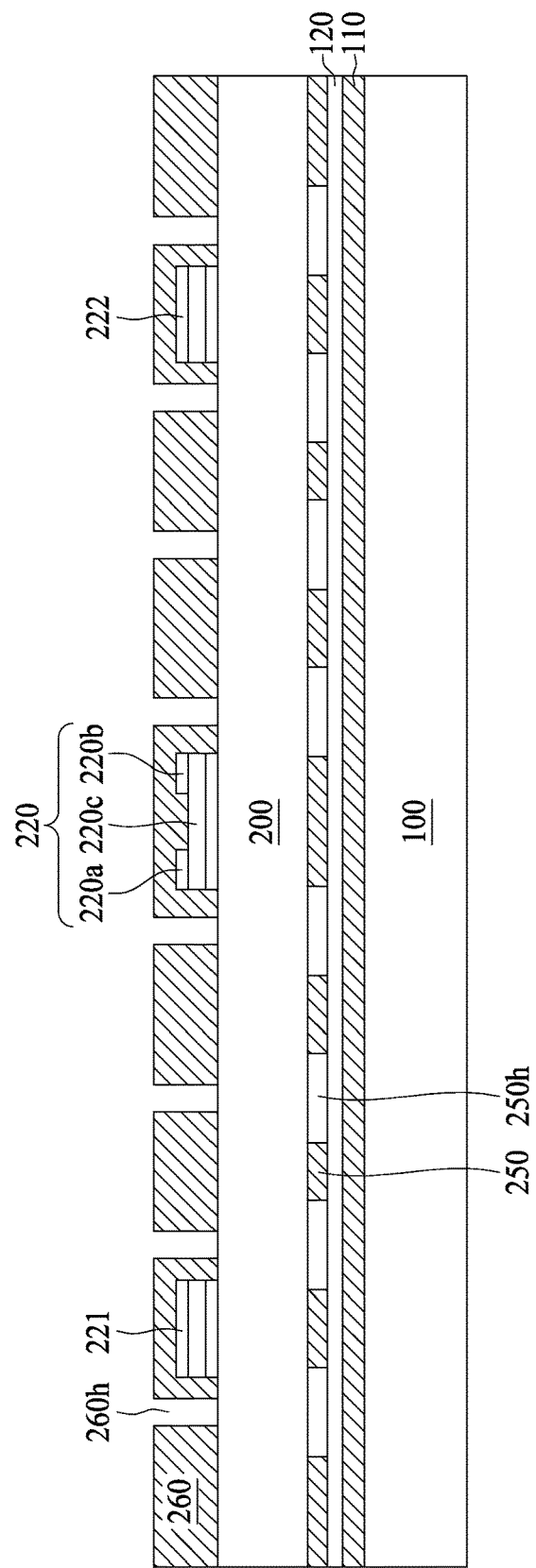

Referring to FIG. 3B, a plurality of conductive layers 220, 221, 222 are formed on the device substrate 200. The conductive layers can be formed by depositing an electrode layer, an insulation layer and an electrode layer on the device substrate 200. The electrode layer is formed of Mo and the insulation layer is formed of MN. In some embodiments, the conductive layer is deposited through electroplating, physical vapor deposition (PVD), or a CVD process. One of ordinary skill in the art would recognize many variations, modifications, and alternatives. The conductive layer is then etched to form the separated conductive layers 220, 221, 222 shown in FIG. 3B. A further etching process is performed on the conductive layer 220 to isolate the electrode 220a and the electrode 220b.

To clarify, a photolithography process in which a photoresist layer is deposited on the conductive layer and patterned to form an etch mask is not shown in this process flow. The dimensions of the etch mask may be tightly controlled during photolithography and the etch mask may be formed from any suitable material that is resistant to the etching process used to etch the conductive layer. In some embodiments, an etch mask of silicon nitride ($Si_3N_4$) is used. In some other embodiments, a photoresist layer can serve as the etch mask. One of ordinary skill in the art would recognize many variations, modifications, and alternatives.

An oxide layer 260 is formed on the device substrate 200 to encapsulate the conductive layers 220, 221, 222. The oxide layer 260 can be formed by HDP, CVD, LPCVD, PECVD or other suitable methods. The oxide layer 260 is then patterned to form a plurality of openings 260h. The oxide layer 260 may be patterned using, for example, a combination of photolithography and etching techniques. Furthermore, the oxide layer 260 may be thinned (not shown) until a desired thickness is achieved. The thinning process may be implemented by using suitable techniques such as grinding, polishing, and/or chemical etching. For example, CMP and/or reactive ion etching (RIE) may be used to thin the oxide layer 260.

Figure 3C:
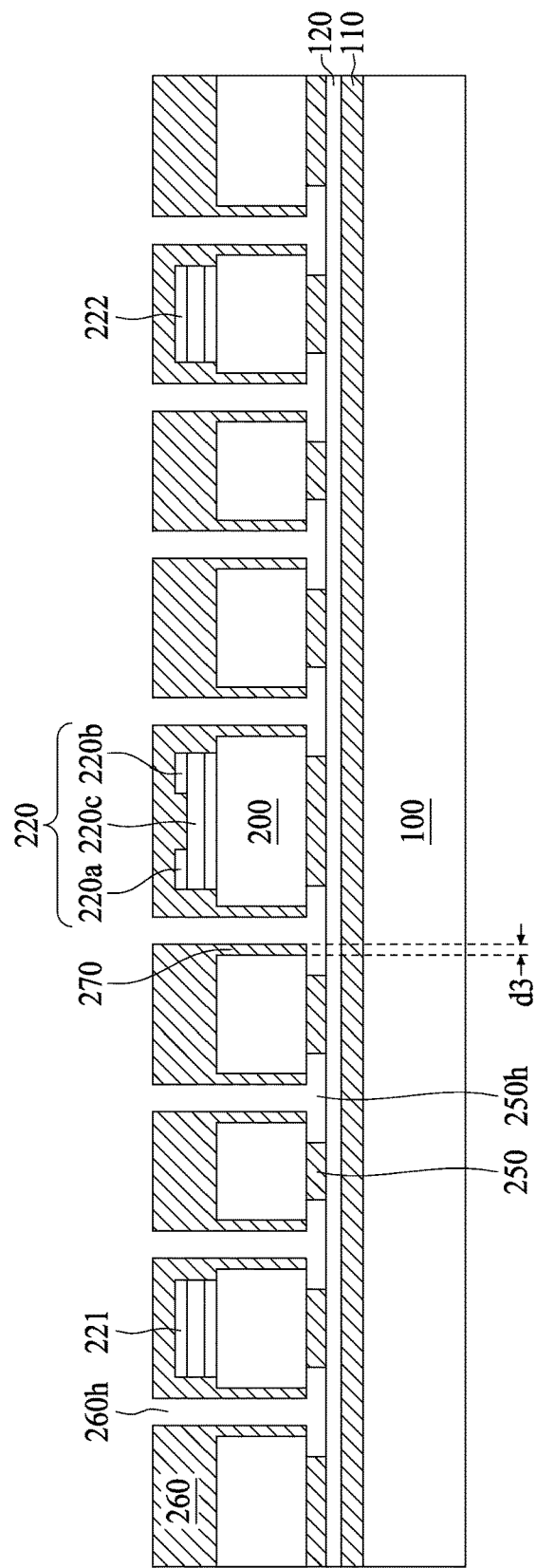

Referring to FIG. 3C, the device substrate 200 is patterned and deep etched to penetrate the device substrate 200 to form a plurality of cavities as illustrated in FIG. 3C. In some embodiments, the patterning and etching techniques may vary depending on the type of MEMS device. For example, the patterning and etching for a MEMS accelerometer is different from the patterning and etching used for a MEMS gyroscope. Existing etching techniques like anisotropic etching, RIE, or the like may be used. The protection layer 120 can serve as an etch stop layer to protect the handle wafer 100 from undesired etching. In some embodiments, a photoresist layer is patterned over the oxide layer 260 to facilitate the etching of the device substrate 200.

In conventional techniques without using the protection layer, if not controlled precisely, the etching process applied to the device substrate 200 may cause undesired etching to the handle substrate, thus affecting the performance of the MEMS device subsequently fabricated. In accordance with some embodiments of the present disclosure, the performance of the MEMS device can be improved by disposing the protection layer 120 on the handle substrate 100. One of ordinary skill in the art would recognize many variations, modifications, and alternatives.

After the etching of the device substrate 200, an oxide layer 270 is then formed on lateral surfaces of each separated device substrate segment as illustrated in FIG. 3C. The oxide layer may be a thermal oxide layer formed by performing a thermal oxidation on lateral surfaces of each device substrate segment. In one embodiment, the thermal oxidation is conducted to control the thickness d3 of the oxide layer being less than approximately 0.5 μm.

Figure 3D:
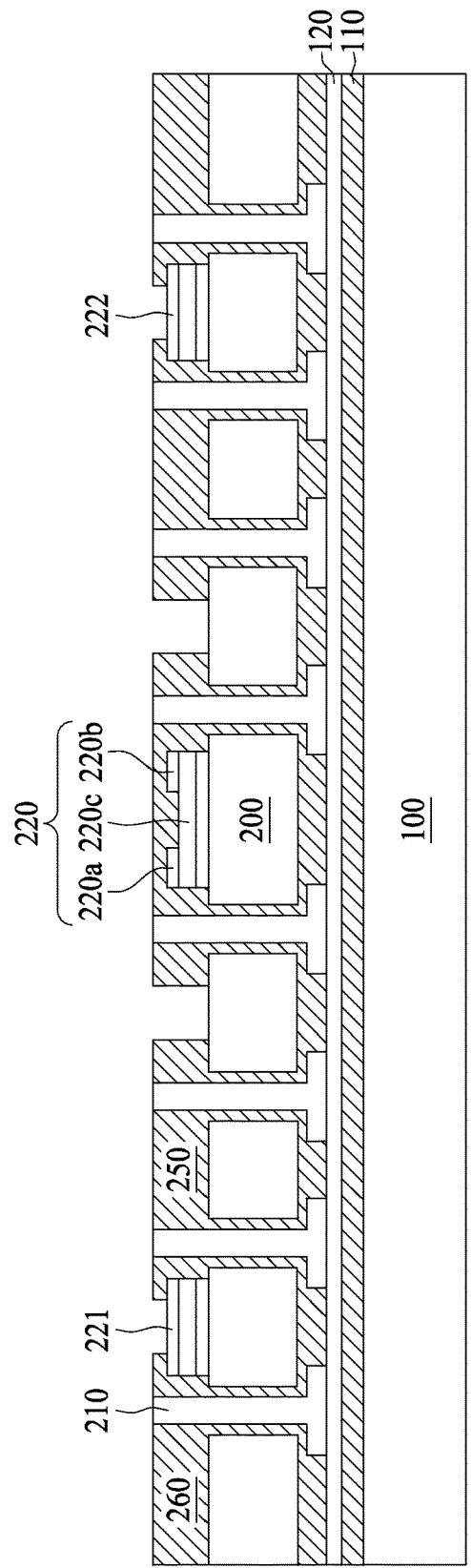

Referring to FIG. 3D, a polysilicon 210 is formed to fill the cavities 260h shown in FIG. 3C. The polysilicon 210 may be deposited into the cavities using suitable techniques such as CVD, and the like. The polysilicon 210 acts as a shield for various components of the MEMS device (e.g., the separated substrate and the conducive layers 220, 221, 222) in the subsequent processing steps. The polysilicon 210 also acts as a bonding interface layer; therefore, other suitable bonding materials such as silicon, amorphous silicon, silicon doped with impurities, combinations thereof, and the like may be used in lieu of polysilicon.

Since the thickness of the oxide layer formed on the lateral surfaces of device substrate segment is less than approximately 0.5 μm, the distance between each device substrate segment and the adjacent polysilicon would be less than approximately 0.5 μm as well.

The oxide layer 260 is then patterned to expose a portion of the conductive layers 221, 222 and a portion of the device substrate 200 as shown in FIG. 3D. The oxide layer 260 may be patterned using, for example, a combination of photolithography and etching techniques.

Figure 3E:
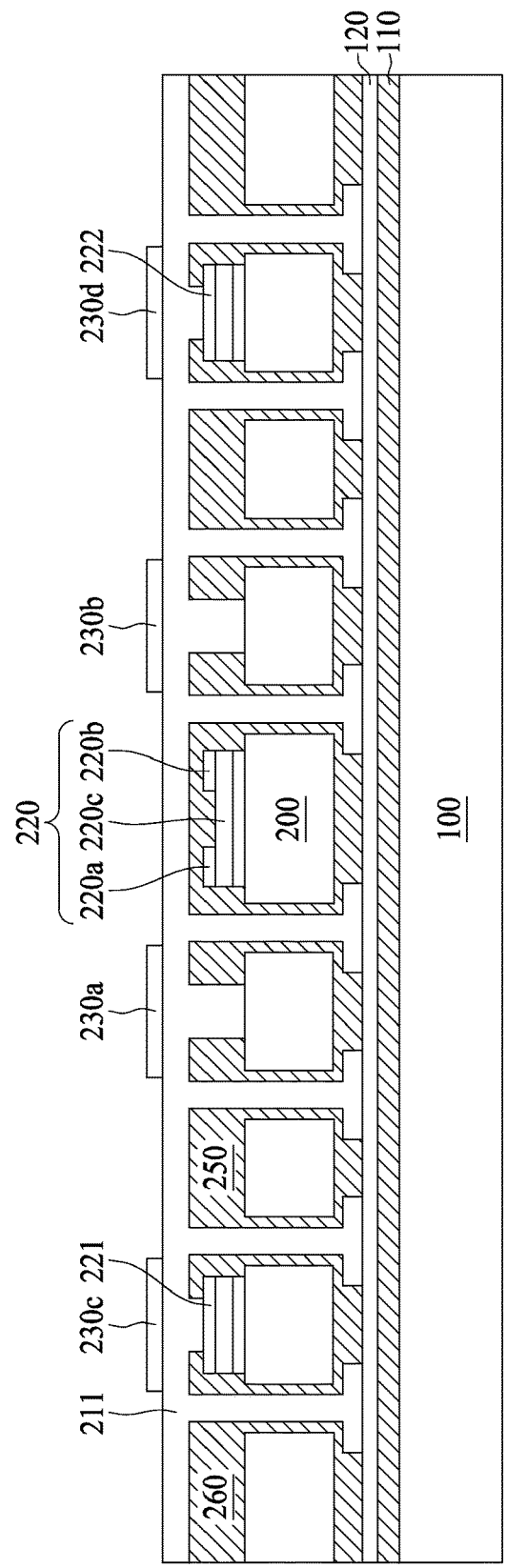

Referring to FIG. 3E, a polysilicon layer 211 is formed to connect each separated polysilicon 210 formed in FIG. 3D, the exposed portion of the conductive layers 221, 222 and the exposed portion of the device substrate 200. The polysilicon layer 211 can be made of silicon, amorphous silicon, silicon doped with impurities, combinations thereof, and the like.

Electrodes 230a, 230b, 230c, 230d are formed on the polysilicon layer 211. The electrode 230c is formed above the conductive layer 221, and the electrode 230d is formed above the conductive layer 222. The electrodes 230a, 230b, 230c, 230d can be formed using various deposition processes, lithography patterning processes, etching processes or a combination thereof on the polysilicon layer 211. In some examples, the electrodes 230a, 230b, 230c, 230d include germanium, aluminum, copper, aluminum/copper alloy, titanium, tantalum, tungsten, metal silicide, or combinations thereof.

Figure 3F:
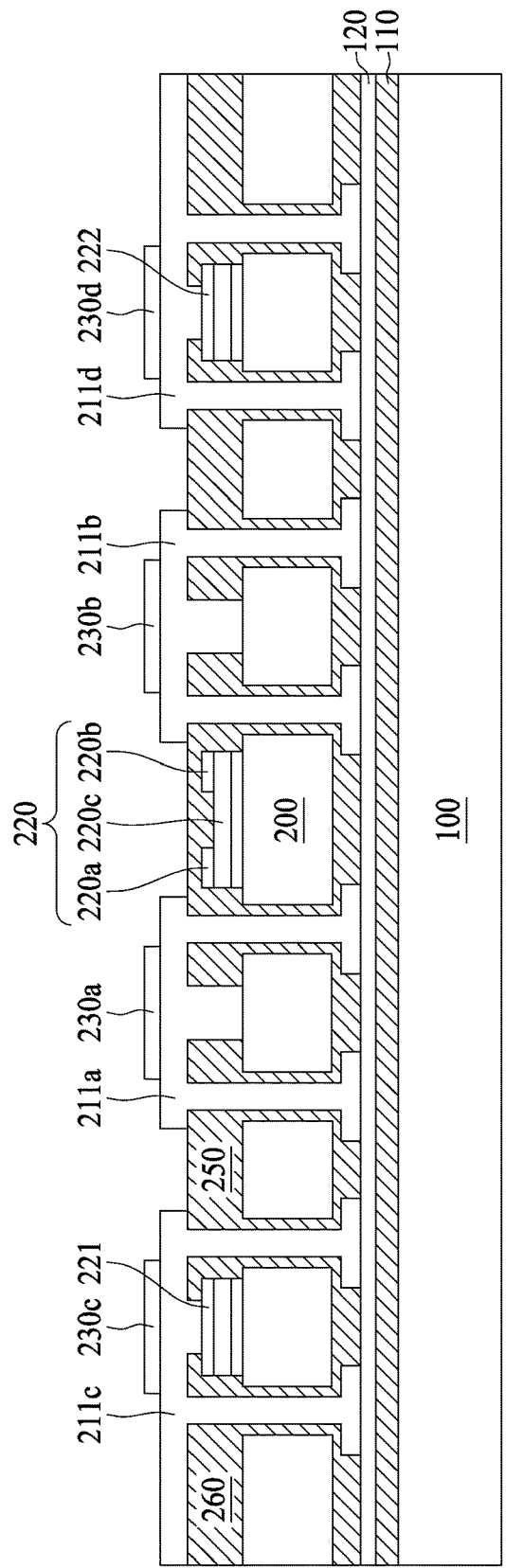

Referring to FIG. 3F, the polysilicon layer 211 is patterned to form separated polysilicon 211a, 211b, 211c, 211d. The polysilicon layer can be patterned using, for example, a combination of photolithography and etching.

Figure 3G:
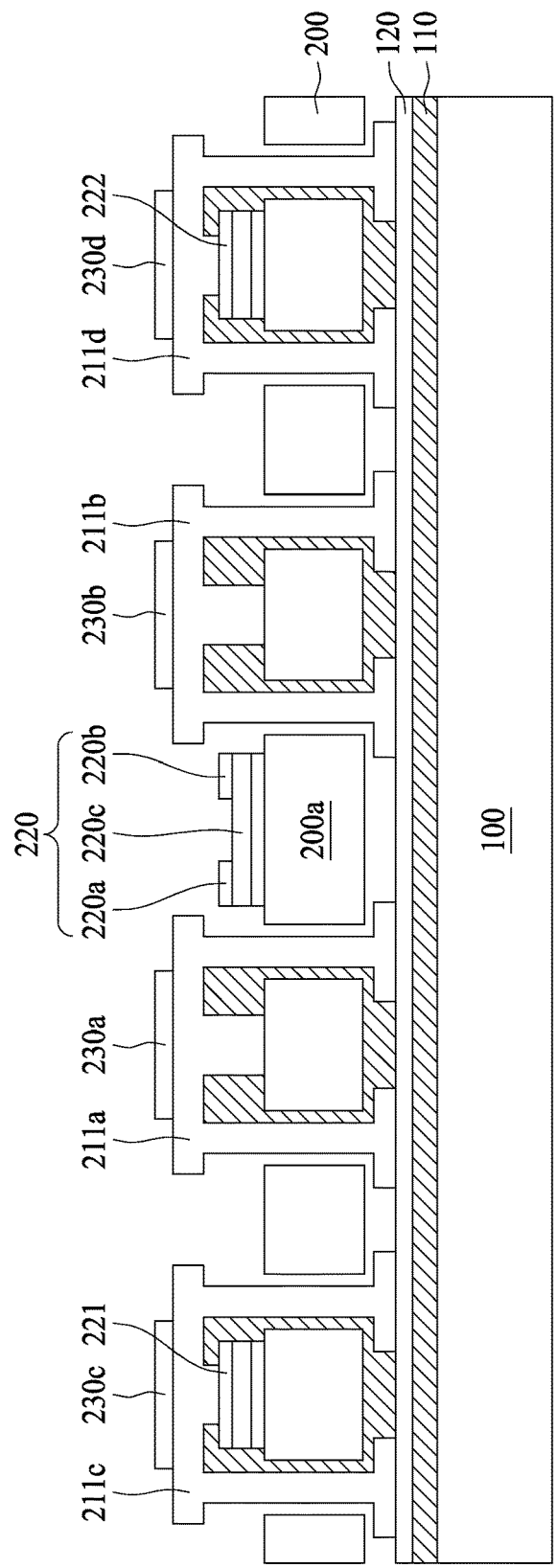

Referring to FIG. 3F and FIG. 3G, a portion of the oxide layers 250, 260 is released to expose a part of the device substrate 200a and the conductive layer 220, so as to form the MEMS device 1 as shown in FIG. 1B. The exposed part of the device substrate 200a can move horizontally between the polysilicon 211a and the polysilicon 211b. It should be noted that the portions of the oxide release layers to be released depend on the layout design.

The movable part 200a and the polysilicon 211a define a capacitor structure. The capacitance of the capacitor structure is determined by the distance between the movable part 200a and the polysilicon 211a. Similarly, The movable part 200a and the polysilicon 211b define a capacitor structure. The capacitance of the capacitor structure is determined by the distance between the movable part 200a and the polysilicon 211b. The horizontal movement of the movable part 200a would change the capacitance of the capacitor structure between the movable part 200a and the polysilicon 211a or the polysilicon 211b.

The capacitance of a capacitor is defined by the following equation: $C=(\varepsilon^*A)/d$, where $\varepsilon$ is permittivity, A is the area of each electrode of the capacitor and d is the distance between two electrodes of the capacitor. Based on the above equation, a high capacitance can be obtained by increasing the area of the electrode and reducing the distance between two electrodes. In accordance with the embodiment of the present disclosure, since the distance between the movable part 200a and the polysilicon 211a or the polysilicon 211b is less than approximately 0.5 µm, the MEMS device would have a higher capacitance in comparison with conventional MEMS devices. The MEMS device would also have better performance due to its higher capacitance. Furthermore, because the polysilicon 211a, 211b and the movable part 200a can be made by materials with different levels of conductivity, it is more flexible to design a capacitor structure defined by the movable part 200a and the polysilicon 211a, 211b.

Figure 3H:
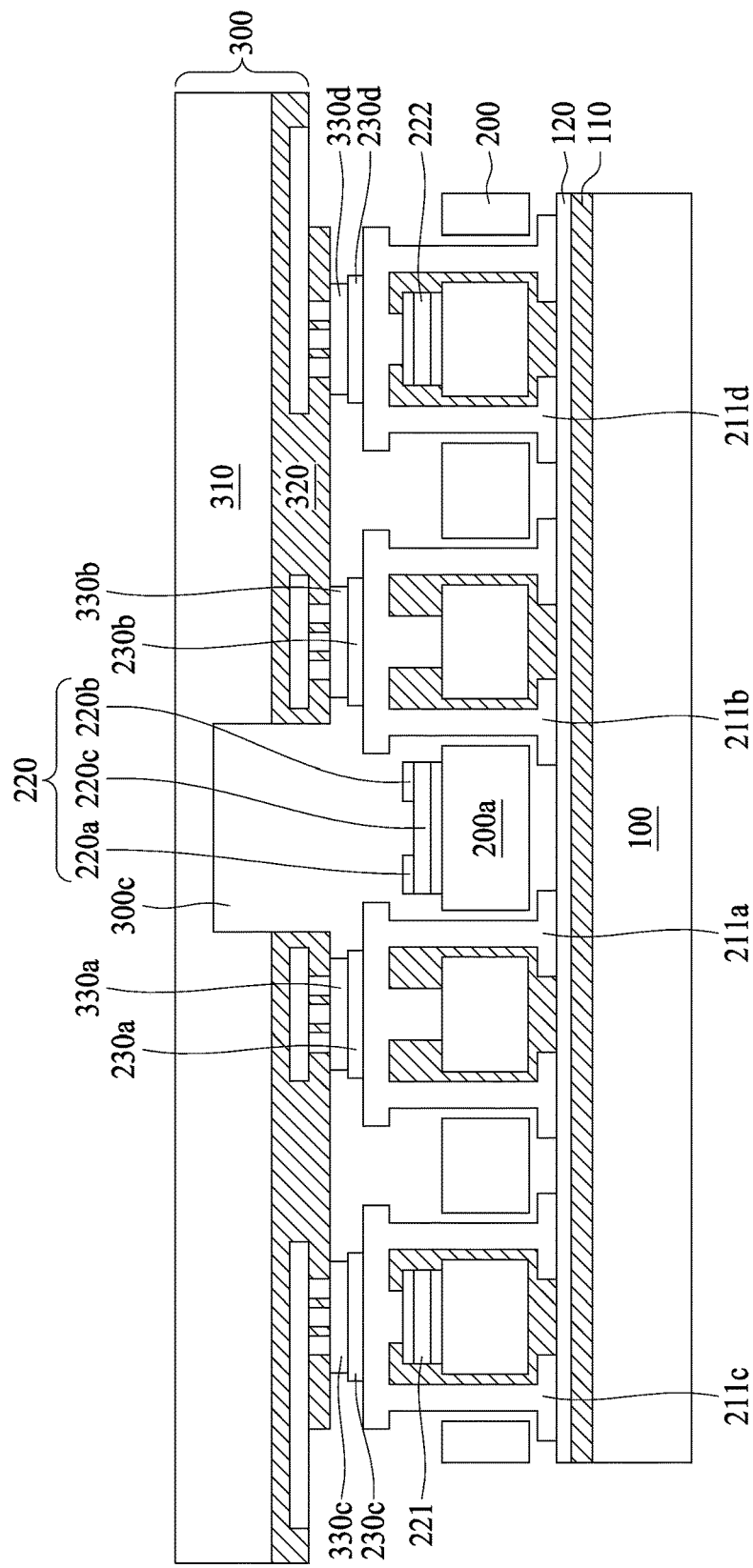

Referring to FIG. 3H, the MEMS device shown in FIG. 3G is bonded to a CMOS wafer 300 to form the MEMS device shown in FIG. 2. The CMOS wafer 300 may include a substrate 310 and an interconnect structure 320. The substrate 310 may include a semiconductor material such as silicon although other semiconductor materials may be used. A plurality of CMOS devices (such as transistors, capacitors, resistors, diodes, photodiodes, fuses, and the like, not shown in the drawing) is formed on a surface of the substrate 310. Furthermore, an interconnect structure 320 is used to electrically couple the CMOS devices. The interconnect structure 320 may include dielectric layers, which further include low-k dielectric layers, non-low-k dielectric layers such as passivation layers, and the like. Metal lines and vias, which may be formed of copper, aluminum, or combinations thereof, are formed in the dielectric layers. A plurality of electrodes 330a, 330b, 330c, 330d are formed at a predetermined location on the interconnect structure 320 corresponding to the electrodes 230a, 230b, 230c, 230d, respectively.

The electrodes 330a, 330b, 330c, 330d of the CMOS wafer 300 respectively electrically connect to the electrodes 230a, 230b, 230c, 230d to provide electrical paths between the CMOS wafer 300 and the device substrate 200. In one embodiment, the signal representing the variation of the capacitance of the capacitor structure defined by the movable element 200a and the polysilicon 211a or the polysilicon 211b can be transmitted from the electrodes 220a, 220b of the conductive layer 220 to the CMOS device of the COMS wafer 300 through the electrical paths between the CMOS wafer 300 and the device substrate 200. In another embodiment, a control signal can be sent from the CMOS device of the COMS wafer 300 to the electrodes 220a, 220b of the conductive layer through the electrical paths between the CMOS wafer 300 and the device substrate 200 to control the movement of the movable element 200a.

The CMOS wafer 300 includes an opening 300c at a location corresponding to the movable element 200a of the device substrate 200. Therefore, the CMOS wafer 300 and device substrate 200 would define a cavity in which the movable element 200a is located after the CMOS wafer 300 is bonded to the device substrate 200. The cavity would increase the space in which the movable element 200a is accommodated. Increasing the space would reduce the cavity pressure exerted on the movable element 200a, thereby enhancing the performance of the MEMS device.

In view of the above, a preferred aspect of the present disclosure is to provide a high performance MEMS device to overcome the problems that conventional MEMS devices have. The residual stress problem of a conventional MEMS device with a thin film structure would be overcome by using a thick device substrate, in accordance with some embodiments of the present disclosure. In addition, a higher capacitance of the capacitor of the MEMS device can be obtained by reducing the distance of the movable element and the adjacent polysilicon, thereby enhancing the performance of the MEMS device. Furthermore, the structure of the MEMS device of the present disclosure is more robust as an etch stop layer is used to protect the handle wafer from undesired etching.

Some embodiments of the present disclosure provide a semiconductor device, comprising a first substrate, a second substrate, a first polysilicon and a second polysilicon. The second substrate includes a movable part and is located over the first substrate. The first polysilicon penetrates the second substrate and is adjacent to a first side of the movable part of the second substrate. The second polysilicon penetrates the second substrate and is adjacent to a second side of the movable part of the second substrate.

Some embodiments of the present disclosure provide a CMOS-MEMS device structure, comprising: a device wafer, a first polysilicon and a second polysilicon. The device wafer has a movable part. The first polysilicon is adjacent to a first side of the movable part of the device wafer. The second polysilicon is adjacent a second side of the movable part of the device wafer, wherein the second side is opposite the first side. The distance between the device wafer and the first polysilicon or the second polysilicon is less than approximately 0.5 µm.

In some embodiments of the present disclosure, a method of fabricating a CMOS-MEMS device structure is provided. The method includes: providing a first substrate; providing a second substrate over the first substrate; etching through the second substrate to form a movable part; forming a first polysilicon penetrating the second substrate and being adjacent to a first side of the movable part of the second substrate; and forming a second polysilicon penetrating the second substrate and being adjacent to a second side of the movable part of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A semiconductor device, comprising:
   a first substrate;
   a second substrate comprising a movable part over the first substrate;
   a first polysilicon penetrating the second substrate and thereby between a first side of the movable part and a first side of a part of the second substrate next to the first side of the movable part, the first polysilicon further laterally extending under a bottom side of the part of the second substrate next to the first side of the movable part, a bottom side of the movable part, and landing on the first substrate; and
   a second polysilicon penetrating the second substrate and adjacent to a second side of the movable part of the second substrate,
   wherein an entire space sandwiched between the first polysilicon and the first side of the part of the second substrate next to the first side of the movable part is filled with oxide.

2. The semiconductor device of claim 1, wherein a distance between the movable part of the second substrate and the first polysilicon or the second polysilicon is less than approximately 0.5 µm.

3. The semiconductor device of claim 1, wherein a thickness of the second substrate is in a range from approximately 20 um to approximately 40 um.

4. The semiconductor device of claim 1, further comprising a protection layer between the first substrate and the second substrate.

5. The semiconductor device of claim 4, wherein the protection layer is formed of low stress Nitride (LSN).

6. The semiconductor device of claim 1, wherein the conductivity of the first polysilicon and the second polysilicon is different from that of the second substrate.

7. The semiconductor device of claim 1, further comprising a conductive layer on the movable part of the second substrate.

8. The semiconductor device of claim 7, wherein the conductive layer is formed of piezoelectric materials.

9. The semiconductor device of claim 7, further comprising a third substrate over the second substrate, the third substrate including at least two electrodes electrically connecting with the conductive layer.

10. A CMOS-MEMS device structure, comprising:
    a substrate;
    a device wafer over the substrate and having a movable part;
    a first polysilicon between a first side of the movable part of the device wafer and a first side of a part of the device wafer next to the first side of the movable part, the first polysilicon further laterally extending under a bottom side of the part of the device wafer next to the first side of the movable part, a bottom side of the movable part, and landing on the substrate;
    a second polysilicon adjacent a second side of the movable part of the device wafer, the second side being opposite to the first side; and
    an etch stop layer for oxide between the movable part and the substrate,
    wherein an entire space sandwiched between the first polysilicon and the first side of the part of the device wafer next to the first side of the movable part is filled with oxide.

11. The CMOS-MEMS device structure of claim 10, wherein the conductivity of the first polysilicon and the second polysilicon is different from that of the device wafer.

12. The CMOS-MEMS device structure of claim 10, wherein a thickness of the device wafer is in a range from approximately 20 um to approximately 40 um.

13. The CMOS-MEMS device structure of claim 10, further comprising:
    a handle wafer; and
    an etching stop layer between the handle wafer and the device wafer.

14. A CMOS-MEMS device structure, comprising:
    a device wafer having a movable part;
    a first polysilicon adjacent to a first side of the movable part of the device wafer;
    a second polysilicon adjacent a second side of the movable part of the device wafer, the second side being opposite to the first side;
    a third polysilicon adjacent to a third side of the movable part of the device wafer, the third side being perpendicular to the first side of the movable part of the device wafer;
    a fourth polysilicon adjacent to a fourth side of the movable part of the device wafer, the fourth side being opposite to the third side; and
    two electrodes over the movable part of the device wafer and in connection with the third polysilicon and the fourth polysilicon, respectively.

15. A method of fabricating a CMOS-MEMS device structure, comprising:
    providing a first substrate;
    forming a first oxide layer patterned with an opening over the first substrate;
    providing a second substrate over the first oxide layer patterned with the opening;
    etching through the second substrate until the opening being exposed so as to form a movable part and a part of the second substrate next to the movable part;
    forming a second oxide layer surrounding a first side of the movable part and the part of the second substrate next to the movable part;
    forming a first polysilicon between the first side of the movable part and the part of the second substrate next to the first side of the movable part, the first polysilicon further laterally extending under a bottom side of the part of the second substrate next to the first side of the movable part.

16. The method of claim 15, wherein forming the second oxide layer comprises forming a thermal oxide, wherein the thickness of the thermal oxide is approximately less than 0.5 µm.

17. The method of claim 15, wherein the first polysilicon is formed by depositing polysilicon into cavities of the second substrate.

18. The method of claim 15, further comprising depositing an etch stop layer above the first substrate, wherein the etch stop layer is formed of low stress Nitride.

19. A method of fabricating a CMOS-MEMS device structure, comprising:
- providing a first substrate;
- providing a second substrate over the first substrate;
- etching through the second substrate to form a movable part;
- forming a first polysilicon penetrating the second substrate and being adjacent to a first side of the movable part of the second substrate;
- forming a second polysilicon penetrating the second substrate and being adjacent to a second side of the movable part of the second substrate, and
- depositing an etch stop layer above the first substrate;
- wherein the first polysilicon and the second polysilicon are further deposited between the etch stop layer and the second substrate.

* * * * *